Sept. 20, 1960 J. PHILIPS 2,953,693

SEMICONDUCTOR DIODE

Filed Feb. 27, 1957

INVENTOR
John Philips
BY
Frederick Shapoe
ATTORNEY

United States Patent Office 2,953,693

Patented Sept. 20, 1960

2,953,693

SEMICONDUCTOR DIODE

John Philips, Pittsburgh, Pa., assignor to Westinghouse Electric Corporation, East Pittsburgh, Pa., a corporation of Pennsylvania Filed Feb. 27, 1957, Ser. No. 642,743

19 Claims. (Cl. 307—88.5)

The invention relates generally to semiconductor diodes and more particularly to semiconductor diodes with controllable reversible breakdown characteristics.

The semiconductor diode of this invention has such characteristics that on exceeding certain specified reverse current and voltage, the diode becomes highly conductive and thereafter will carry a substantial reverse current at low voltages. This phenomena is not Zener breakdown, nor is it an avalanche breakdown. This unique breakdown characteristic can be repeated indefinitely. The diode of this invention will be designated as having hyperconductive breakdown.

The object of the invention generally stated is to provide a semiconductor diode structure which may be driven to a highly conductive state in the reverse direction by the application of power and thereafter may be retained in that state with the expenditure of a very small amount power.

It is also an object of the invention to provide a semiconductor diode having a source of carriers which upon energization gives up readily the carriers and renders the semiconductor diode highly conductive in the reverse direction to enable its efficient use in the performing of switching operations with the expenditure of a small amount of power.

Other objects of the invention will, in part, be obvious and will, in part, appear hereinafter.

The invention accordingly comprises an article of manufacture possessing the features, properties, and the relation of elements which will be exemplified in the article hereinafter described and the scope of the application of which will be indicated in the claims.

For a fuller understanding of the nature and objects of the invention, reference should be had to the following detailed description taken in connection with the accompanying drawing, in which.

Figure 1:
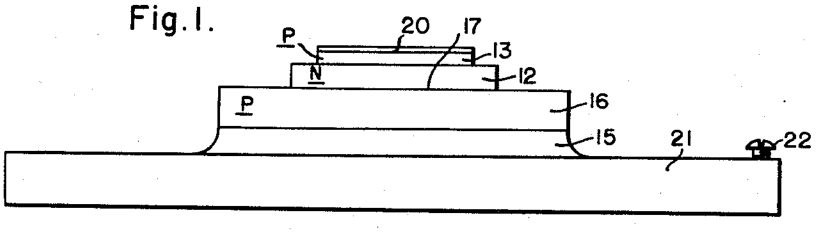
Figure 1 is an enlarged view in side elevation of a design of a semiconductor diode embodying the features of the invention.

Referring now to the drawing, the semiconductor diode or semiconductor rectifier with controllable reversible breakdown cahracteristics or hyperconductive breakdown comprises a doped semiconductor wafer and certain applied elements, the construtcion and function of which will be described hereinafter.

In the making of the semiconductor diode, a semiconductor crystal having the required characteristics is prepared in accordance with well-known practices. The characteristics of the crystal will depend on the specifications to be met by the semiconductor diode. If the structure is to be a PNP type, the crystal as it is grown will be doped to the necessary extent with an impurity which will give it P-type characteristics. In making semiconductor diodes of the kind to be described hereinafter, both germanium and silicon may be employed.

In Fig. 1 is illustrated a semiconductor diode structure of this invention. The diode comprises a first base element 12 which consists of a semiconductor member doped with an impurity to provide a first type of semiconductivity, either N or P. Upon the base 12 is an emitter 13 consisting of semiconductor material doped with the opposite type of semiconductivity. The emitter 13 may be prepared by alloying a pellet containing a doping impurity to a wafer of semiconductor material forming the base 12. An emitter junction is present at the zone between base 12 and emitter 13.

In order to facilitate the connecting of the diode into an electrical circuit a layer 20 of silver or other good conductor metal may be fused, alloyed into or soldered with the upper surface of emitter 13. Copper lead wires may be readily soldered to layer 20.

A second base 16 of opposite conductivity is provided next to the first base 12. A zone 17 where bases 12 and 16 meet forms a collector junction.

Next to the second base 16 is a mass of metal 15 which is a source of carriers that play a critical part in the functioning of the diode. The mass of metal 15 may be neutral or it may have the same doping characteristics as the second base 16. The mass of metal 15 may be applied to the base 16 by soldering, alloying, fusing or other similar well-known methods.

A base treminal 21 may be provided for mounting the diode when put in use and to conduct current to mass 15. It performs no function in the operation of the diode. The base terminal 21 is preferably made from any of the well-known metals or alloys which readily conduct electrical current. A terminal post 22 is mounted on the base terminal to receive a lead that may be employed to connect the diode in a circuit. The base terminal 21 may be attached to the metal mass 15 by brazing or soldering.

Figures 2, 3, 4, 5, 6:
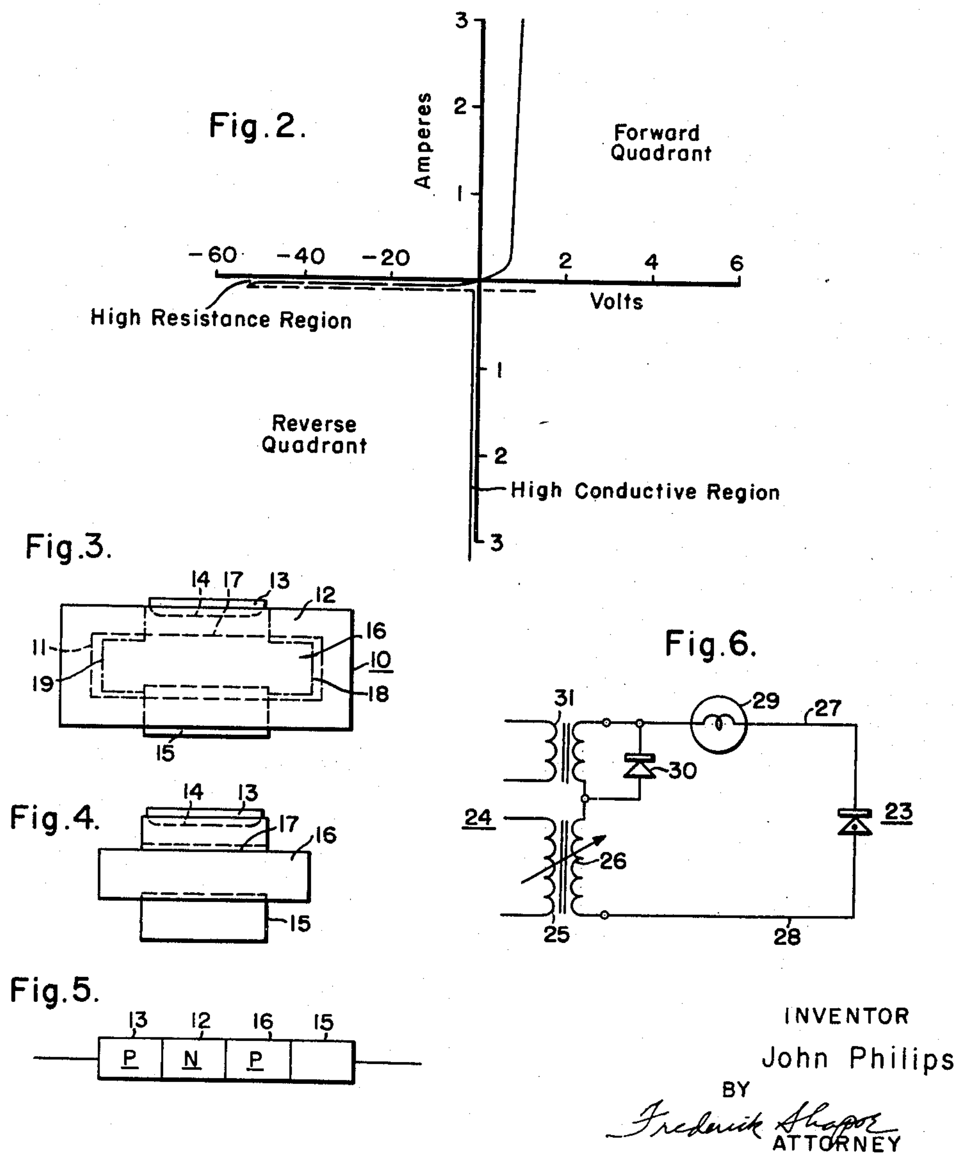
Fig. 2 is a diagram of a curve plotted from measurements made during the operation of a semiconductor diode constructed in accordance with the teachings of this invention.
Fig. 3 is an enlarged view in side elevation of a semiconductor diode showing a crystal wafer after it has been partly processed to add all the elements required to form a complete operable unit.
Fig. 4 is an enlarged view in side elevation of the semiconductor diode illustrated in Fig. 3 processed further with all unnecessary parts removed, to make a finished unit.
Fig. 5 is a diagrammatic view of the semiconductor diode structure of this invention showing an added element which is required in accordance with the teachings of this invention.
Fig. 6 is a circuit diagram showing a simple circuit to illustrate how the semiconductor diode of this invention may be untilized for performing switching operations.

The process of preparing the semiconductor diode will be described with reference to Figs. 3 and 4. More particularly, a semiconductor diode made from a germanium wafer 10 doped with a suitable impurity, such as gallium, to give it P-type characteristics will be described in detail. After the wafer 10 is cut from a germanium single crystal bar, it is etched and cleaned in accordance with well-known practice. In order to provide an N-type zone in the wafer, a thin surface layer of the whole wafer is doped with an N-type impurity such as arsenic, antimony, phoshorus or the like. The doping may be performed in different ways. It is satisfactory to place the wafer in an evacuated chamber and deposit arsenic vapor in the surface thereof by a gaseous diffusion process to predominate over the P-type impurity in the wafer at the surface. As shown in Fig. 3, the arsenic is diffused into the wafer to the depth indicated by the dotted line 11. The concentration of the N-type doping impurity in the wafer will be heavier at the surface and will gradually decrease to the dotted line 11. Thereby, a definite N-zone 12, which is the first base element, will be provided over the surface of the wafer.

Next, a predetermined area of the surface of the wafer will be further doped with an impurity having P-type characteristics. For this purpose, a P-type impurity, such as indium, gallium, aluminum or similar materials having P-type characteristics may be employed. In doping with aluminum, a thin sheet of aluminum foil, or aluminum alloy, may be applied to the wafer and heated to the required temperature to cause it to alloy with or into the N-zone 12. After the alloying has been successfully completed, a P-zone or element which constitutes an emitter 13 will be provided on the upper surface of the wafer 10. The doping with aluminum is so predominant that the N-doping impurity will be overcome. A central core 16 of the wafer 10 remains with P-type conductivity.

Since the emitter 13 has P-type characteristics and is in intimate contact with the N-type zone 12, a P-N junction 14 is formed. If the ratio of the conductivities of the two zones is favorable, the P-type element will emit holes efficiently into the N-type base 12.

On the opposite side of the wafer 10, a mass of metal 15 is applied. When a PNP diode structure is being made, the mass of metal 15 applied will be selected to have neutral or P-type doping characteristics similar to a P-zone 16, or a second base element, shown inside the dotted line 11. In a number of semiconductor diodes made, the mass of metal, with P-type doping characteristics, applied to the second base element 16, was indium. In applying the mass of metal 15, the germanium wafer 10 and indium 15, for instance, were heated to an alloying temperature until the indium penetrated through the N-zone 12 to establish an intimate contact with the P-type zone 16. The zone 12 doped with N-type impurities near mass 15 may or may not be removed prior to the attachment of the mass of metal 15.

In this manner, two base elements 12 and 16 are provided, the second base 16 being in contact with the first base 12. The zone where the base 12 and base 16 come together at line 11 forms a collector junction 17. The formation and function of collector junctions are well known in the art.

The base 12 is of N-type and the base 16 is of P-type germanium. The base 16 is germanium that was doped with a P-type impurity in the growing of the crystal from which the wafer 10 was made. The mass of metal 15 may be a metal alloy. In a specific embodiment, a germanium-indium alloy was produced by applying indium to the germanium. The metal mass may be applied to the base 16 by soldering, alloying, plating or any other suitable method.

The base 16 comprising P-type doped germanium will not have a large number of electrons, which are the minority carriers in this instance, free to flow on energization. The mass of metal 15, for example, an alloy of germanium and indium, will have great numbers of electrons free to flow on energization with electrical current. Further, the mass of metal 15 in the bonding process makes such intimate contact with the base 16 that it is possible for the electrons, in this case minority carriers, to flow from one to the other readily.

In the structure illustrated in Fig. 3, there is now a P-element or emitter 13 at the top with an N-element or base 12 located below it. Between these two elements 12 and 13 is the zone which constitutes the emitter junction 14. Next to the base 12 is the germanium P-type base element 16 with a zone between these two elements which constitutes the collector junction 17. The last element is the mass of metal 15 which is, in this case, an alloy of germanium and indium in intimate contact with the P-type base 16.

The structure as illustrated in Fig. 3 still has extending around the outside of the wafer the layer 12 doped with N-type impurities. This, of course, would short-circuit the structure if it was attempted to use it as shown in Fig. 3. The next step in the process is to apply masking material to the essential elements such as 13 and 15 and then etch the excess portions of layer 12 doped with N-type impurities to remove it completely, except below emitter 13. In practice, the wafer will be etched away down to the lines 18 and 19 and to the sides of the mass of metal 15. When the etching process has been completed, there will remain an operative semiconductor unit as shown in Fig. 4.

The etching operation may be effected by the use of any suitable etching solution. A nitric-hydrofluoric acid etching solution has been used successfully.

When a structure as shown in Fig. 4 has been completed, provision will be made for mounting it and making the necessary electrical connections. Such a complete structure is shown in Fig. 1. Silver or some other suitable metal may be applied to the aluminum containing P-type element 13 for making electrical connections thereto. The silver layer 20 is a good conductor and a copper conductor or terminal may readily be soldered to it. In order to mount the semiconductor diode unit in apparatus with which it is to be utilized, a suitable mounting member is provided. In this instance, a mounting member 21, for example of a nickel-cobalt-iron alloy known as Kovar, is provided and the mass of metal 15 is either fused or solder to it. The Kovar alloy is a satisfactory electrical conductor, and the terminal 22 is provided on it for connecting another electrical conductor. There are now provided two terminals 20 and 22 for connecting the semiconductor diode into an electrical circuit. The semiconductor diode, as shown diagrammatically in Figs. 1, 3 and 4, actually comprises a PNP structure plus a mass of metal in intimate contact with the base 16.

The embodiment of the invention described in detail hereinbefore comprises a germanium crystal to which elements are added to make the PNP structure plus a mass of metal. A silicon crystal has been utililized successfully. When the silicon crystal is utilized, suitable doping materials may be employed, such as those mentioned with germanium, in accordance with practices well known in the art.

The embodiment of the invention described is illustrated diagrammatically in Fig. 5 constitutes a PNP structure plus an added mass of metal. Starting with either a germanium or silicon crystal wafer and properly selecting the doping materials therefor, an NPN structure plus an added mass of metal having N-type doping characteristics can be made. When an NPN structure is made, the doping impurity would confer a conductivity in which the carriers in the second base 16 would not be electrons but, instead, would be holes. The flow of holes in the operation of an NPN semiconductor diode would be the opposite of the flow of electrons in the embodiment of the invention described previously.

In making semiconductor diodes of the PNP-type such as described hereinbefore, many different metals and alloys may be employed as the mass of metal 15. The mass of metal employed will have either doping characteristics corresponding to the carrier characteristics of the base 16 which it contacts or have neutral doping characteristics. The mass of metal 15 has been made successfully from the following materials:

(1) Pure indium
(2) Pure tin
(3) 1% gallium and the remainder indium
(4) 10% gold, 3% aluminum and the remainder silver
(5) 3% aluminum silver and the remainder indium
(6) 5% indium and the remainder tin
(7) 5% indium, 2% aluminum and the remainder tin
(8) 10% aluminum, 20% silver and the remainder indium
(9) 10% aluminum, 30% silver and the remainder indium.

Semiconductors employing such masses of metal function satisfactorily. Many other compositions may be prepared for making metal mass elements in the light of this information. Such masses of metal 15 serve as a source of minority carriers to bring about the proper functioning of the semiconductor diode.

The spacing of the emitter junction 14 to the collector junction 17 should be within a minority carrier diffusion length and the first base should have such carrier characteristics so that a high proportion of all the minority carriers injected by the emitter will reach the collector junction.

Since the mass of metal 15 when energized is a source of minority carriers which cooperate in the reverse breakdown or rendering of the semiconductor diode highly conductive, attention must be given to its location relative to the collector junction. In addition to the mass of metal 15 being disposed in intimate contact with the base member 16 to provide for the flow of minority carriers, attention has to be given to the diffusion length of the carriers involved. Otherwise, an adequate number of the carriers may not reach the collector junction 17. As is well known in the art, diffusion length is the measure of distance a selected proportion of minority carriers will travel before absorption or trapping. Therefore, the mass of metal 15 must be so located that an adequate number of the minority carriers will reach the collector junction. In many cases the distance to the collector junction has been substantially less than a diffusion length. However, good results will be obtained when the distance comprised several diffusion lengths—for instance of the order of 2 to 10 diffusion lengths.

The minority carrier is an electron in P-type material and a hole in N-type material. They must reach the collector junction at a predetermined rate to effect breakdown or the rendering of the diode highly conductive in the reverse direction. When a PNP or NPN structure is made and a mass of metal added which serves as a plentiful source of minority carriers which will flow readily on energization, efficient functioning of the device is assured.

The foregoing description sets forth semiconductor diode structures and processes which have been found to be satisfactory and efficient.

Referring now to Fig. 2, the curve shows how the semiconductor diode responds to the application of different voltages. Considering the upper right or forward quadrant, when a forward voltage of the order of one volt was applied, the current built up to about three amperes. When the voltage was reversed, it built up in the reverse direction to about 55 volts with only a small fraction of an ampere of current flowing, and then the diode suddenly became highly conductive and the voltage dropped to about one volt as shown in the lower left or reverse quadrant. The diode became a conductor with low ohmic resistance and the current built up rapidly to several amperes.

As shown in the reverse quadrant when the diode broke down the voltage dropped along a substantially straight line to about one volt, and very little power is dissipated in maintaining the diode highly conductive. The diode can be rendered highly resistant again by reducing the current below a minimum threshold value and the voltage below breakdown value. Consequently, the curve can be repeatedly followed as desired by properly controlling the magnitude of reverse current and voltage.

The breakdown or process of the diode becoming highly conductive in the reverse direction occurs within a small interval of time. Investigations have revealed that from the time of subjecting the diode to the necessary voltage in the reverse direction to render it highly conductive to the time when it sustains relatively high current at a low reverse voltage, comprises an interval of the order of one tenth of a microsecond. Further, it has been found that the breakdown characteristics of the diode in the reverse direction will respond to currents of a very wide range of frequencies, of the order of 1 megacycle.

In using the semiconductor diode for switching operations in control systems, it is good practice to subject it to a constant reverse voltage somewhat below the voltage required to effect breakdown or the rendering of the unit highly conductive. A control voltage which will supplement or add to the constant voltage may then be employed to effect the breakdown. The voltage of the control system will depend on the constant voltage applied and may be of the order of 1 to 2 volts depending on the conditions to be met. The switching operations effected by the employment of a control system will not necessitate the interruption of heavy currents or employ high voltages.

Semiconductor diodes of this type can readily be manufactured by known techniques. A very high percentage of satisfactory diodes have been produced in accordance with this invention.

The semiconductor diode described hereinbefore may be utilized either as a switch or a rectifier. A great number of different circuit connections may be made for employing the diode to perform the functions of which it is capable. In order to illustrate its use, a simple circuit diagram illustrating how the diode 23 may be employed as a switch is given in Fig. 6.

Assume now that the semiconductor diode 23 was designed for and will break down when subjected to a reverse voltage of 110 volts. A variable transformer shown generally at 24 is provided with a primary winding 25 which may be connected to any suitable power source (not shown) and secondary windings 26. The transformer will be adjusted to deliver 108 volts at the terminals of the secondary 26. In order to step the voltage of the secondary of the transformer 26 up to 110 volts to effect a breakdown of the diode 23, a control transformer 31 is provided. This control transformer may be supplied from any suitable power source (not shown). In this instance, the control transformer 31 is a high impedance transformer and is capable of delivering two volts at the terminals of the secondary.

The secondary of the transformer 26 and the secondary of the control transformer 31 are connected in series circuit relationship and across the diode 23. One terminal of the secondary coil of transformer 26 is connected to one side of the diode 23 through conductor 28, and the free terminal of the auxiliary transformer 31 is connected to the other side of the diode through conductor 27. A lamp 29 is connected in the conductor 27 to indicate when the diode has been rendered highly conductive to carry current in the manner of a closed switch. A rectifier 30 is connected across the secondary of the auxiliary transformer 31.

Normally, at 108 volts in coil 26, only a small negative current will pass through the diode 23. In the functioning of the circuit illustrated in Fig. 6, a negative cycle of current flow is applied to the transformer 31 such that a voltage of 2 volts will be impressed upon the rectifier 30. However, rectifier 30 will not permit the current to pass through it and the current can only flow through the circuit of conductors 27 and 28. Therefore, the 2-volt potential is cumulative with the negative voltage of 108 volts across the secondary of the transformer 26. Consequently, a total reverse voltage of 110 volts will be impressed across the diode 23. Diode 23 will now break down and become highly conductive. Current will flow from the transformer 26 through lamp 29, conductor 27, through diode 23 and conductor 28 back to the transformer. Due to the high impedance of transformer 31, this heavy current will produce a countervoltage in the windings of the transformer, and a positive voltage is generated which switches diode 30 into the forward state. On the completion of the negative half cycle in coil 26, positive cycle current will flow readily in circuit 27—23—28—29. On the next negative half cycle, this operation is repeated.

Many semiconductor diode units have been made and tested. By proper selection of the elements, some variation in the results can be obtained. It has been found that with some structures, when the diode is subjected to a reverse voltage of the order of 45 to 50 volts, it will become highly conductive. The voltage will immediately drop to about one volt, and current flow can be maintained with this voltage to high amperage values. In many instances, it was found that one volt was adequate to sustain a flow of current of the order of 10 amperes for long periods of time. Further, with very small voltages, currents of much higher amperages were caused to flow for varying periods of time—such as for short pulses.

In the designing of the diodes for performing switching operations, it is necessary to provide for the blocking of high voltages with negligible leakage current and yet have very high conductance after breakdown. Diodes have been designed and made that breakdown or become highly conductive at predetermined reverse voltages that run through a range reaching as high as hundreds of volts. Further, in the high resistance region short of breakdown, the diode sustains a voltage of the order of 100 volts with a leakage current flow of the order of one milliampere.

The following table is an average of voltages and currents which were measured in a large number of tests on a particular semiconductor diode manufactured in accordance with this invention:

| $V_c$ (volts): | $I_c$ |
|---|---|
| −3 | 3.8 microamperes. |
| −10 | 6.2 microamperes. |
| −20 | 9.8 microamperes. |
| −30 | 13 microamperes. |
| −40 | 22 microamperes. |
| −45 | 42 microamperes. |
| $-46=V_b$ | About 1 milliampere. |
| −1 | Up to 10 amperes. |

$V_b$ is the hyperconductive breakdown voltage, the current being about 1 milliampere. Thereafter, the diode conducts up to 10 amperes, reverse current, at about one volt.

It may help in understanding the method of making and the functioning of the semiconductor diode if dimensions of a specific PNP diode structure manufactured are given. In order to meet predetermined specifications, a germanium crystal wafer 10 which was about one-quarter inch in diameter and from .005 inch to 0.007 inch thick was prepared. This crystal was doped with arsenic and etched in accordance with the information given hereinbefore. When finished, the N-type base 12 was about 0.1 inch in diameter and 0.0002 inch thick. The P-type base 16 was about one-quarter inch in diameter and from 0.003 to 0.005 inch thick. The mass of metal 15 was the same diameter as the base 16 and 0.004 inch thick. While these dimensions will give anyone a fair idea of the size of the structure, it is to be understood that in order to meet different specifications and operating conditions, these dimensions may be varied to meet the requirements.

In the embodiments described, the breakdown or the rendering of the diode highly conductive is effected by the application of a reverse voltage. This was just by way of example since breakdown may also be effected by the application of energy in other forms, for example, radiant energy. As is known, when radiant energy is applied it generates a current in the diode. When the current reaches the rated value for the diode in use, breakdown will occur and the diode will become highly conductive.

The embodiments of the invention described hereinbefore were made from germanium and silicon with selected doping materials. This was not intended to be a limitation but simply illustrative of suitable semi-conductor materials. The semiconductor diodes can be made from stoichiometric compounds of the elements of Groups III and V of the periodic classification.

The application of diodes embodying the features of the present invention are numerous. Fundamentally, it is a diode that may be employed for performing switching operations. There are many obvious applications in the art as, for example, in electronic systems and certain other fields where applications may be made by those aware of the specific problems, as for instance in the field of lightning protection. Also, the semiconductor diode can be employed as a rectifier, providing voltage in reverse direction does not reach the breakdown point in normal use.

Since certain changes may be made in the above article and different embodiments of the invention could be made without departing from the scope thereof, it is intended that all matter contained in the above description or shown in the accompanying drawing should be interpreted as illustrated and not in a limiting sense.

I claim as my invention:

1. In a semiconductor diode in combination, an emitter comprising a semiconductor member having a first type of semiconductivity, an electrical conductor attached to the emitter, a base element next to the emitter, the base element comprising a semiconductor member having the opposite type of semiconductivity, an emitter junction between the emitter and base element, a second base element, the second base element comprising a semiconductor member with the first type of semiconductivity, a collector junction between the base elements, a mass of metal in intimate contact with the second base element, the mass of metal having minority carriers, the mass of metal being in such intimate contact with the second base element that the minority carriers may flow from it to the second base element, a second electrical conductor attached to the mass of metal, and the two electrical conductors being the sole electrical conductors in the diode.

2. In a semiconductor diode in combination, an emitter, an electrical conductor attached to the emitter, a base element next to the emitter, an emitter junction between the emitter and base element, a second base element, a collector junction between the base elements, a mass of metal in intimate contact with the second base element, the mass of metal having minority carriers, the mass of metal being in such intimate contact with the second base element that the minority carriers may flow from it to the second base element, the mass of metal being so disposed relative to the second base element that it is within ten diffusion lengths from the collector junction, a second electrical conductor attached to the mass of metal, and the two electrical conductors being the sole electrical conductors in the diode.

3. In a semiconductor diode in combination, a P-type emitter, an electrical conductor attached to the emitter, an N-type base element next to the emitter, an emitter junction between the P-type emitter and N-type base element, a P-type base element next to the N-type base element, a collector junction between the base elements, a mass of metal having P-type doping characteristics in intimate contact with the P-type base element, electrons in the mass of metal, the mass of metal being in such intimate contact with the P-type base element that the electrons may flow from it to the P-type base element, a second electrical conductor attached to the mass of metal, and the two electrical conductors being the sole electrical conductors in the diode.

4. In a semiconductor diode in combination, a P-type emitter, an N-type base element next to the emitter, an electrical conductor attached to the emitter, an emitter junction between the P-type emitter and N-type base element, a P-type base element next to the N-type base element, a collector junction between the base elements, a mass of metal having neutral doping characteristics in intimate contact with the P-type base element, electrons in the mass of metal, the mass of metal being in such intimate contact with the P-type base element that the electrons may flow from it to the P-type base element, the mass of metal being so disposed relative to the P-type base element that it is within ten diffusion lengths from the collector junction, a second electrical conductor attached to the mass of metal, and the two electrical conductors being the sole electrical conductors in the diode.

5. In a semiconductor diode in combination, a two electrode structure comprising an emitter and two base elements joined together, with the emitter being joined only to a next base element, an emitter junction between the emitter and the next base element, the emitter and next base element being of different semiconductivity type characteristics, a collector junction between the base elements, a mass of metal in intimate contact with the second base element, the mass of metal having minority carriers, the minority carriers in the mass of metal being free to flow to the second base element when energized and one electrode attached to the emitter and the other electrode to the mass of metal, the two electrodes being the only electrodes attached to the diode.

6. In a semiconductor diode structure in combination, a two electrode structure comprising an emitter and two base elements, the base elements having opposite semiconducitvity characteristics, an emitter junction between the emitter and one base element, a collector junction between the base elements of opposite carrier characteristics, a mass of metal, the mass of metal having minority carriers, the mass of metal being disposed in such intimate contact with the base element next to the collector junction that minority carriers may flow from one to the other and it is within ten diffusion lengths of the collector junction to provide for flow of the minority carriers to the collector junction when energized.

7. In a semiconductor diode in combination, a plurality of elements having predetermined opposite semiconductivity characteristics, the elements with opposite carrier characteristics being arranged alternately, emitter and collector junctions between the alternately, arranged elements, a mass of metal joined to the element next to the collector junction, the mass of metal having minority carriers, the mass of metal being disposed in such intimate contact with the element next to the collector junction that minority carriers may readily flow from it to the latter and the mass of metal being within ten diffusion lengths of the collector junction to provide for the flow of minority carriers to the collector junction when energized.

8. In a semiconductor diode device in combination, an emitter having a predetermined type of semiconductivity characteristic, an electrical conductor attached to the emitter, a first base disposed next to the emitter, the first base having the opposite semiconductivity characteristics from the semiconductivity characteristic of the emitter, a second base having semiconductivity characteristics opposite to the semiconductivity characteristics of the first base disposed adjacent to the first base electrode, a collector junction between the two bases, and a mass of metal joined to the second base electrode, the mass of metal having minority carriers, the minority carriers flowing to the collector junction upon energization, a second electircal conductor attached to the mass of metal, and the two electrical conductors being the sole electrical conductors in the diode.

9. In a semiconductor diode, in combination, a PNP structure comprising an emitter doped with P-type impurities, an electrical conductor attached to the emitter, a base carrying N-type impurities, a second base carrying P-type impurities, a collector junction between the base carrying N-type impurities and the base carrying P-type impurities and a metal mass in intimate contact with the base carrying P-type impurities, the metal mass having electrons so that upon energization they will flow toward the collector junction, the mass of metal being so disposed that it is within ten diffusion lengths from the collector junction and one electrode attached to the emitter and another electrode attached to the mass of metal, the two electrodes being the only conductors attached to the diode.

10. In a semiconductor diode in combination, a PNP structure comprising an emitter and a plurality of base elements, the emitter having P-type characteristics, a first base element having N-type characteristics joined in cooperative relationship with the emitter to provide an emitter junction between the emitter and the base element, a second base element having P-type characteristics and joined in cooperative relationship with the first base element to provide a collector junction between the base elements, a mass of metal joined in intimate contact with the second base element, the mass of metal having electrons so that upon energization they will flow toward the collector junction and one electrode attached to the emitter and another electrode attached to the mass of metal, the two electrodes being the only conductors attached to the diode.

11. In a semiconductor diode in combination, a PNP structure comprising an emitter and a plurality of base elements, the emitter having P-type characteristics, one base element having N-type characteristics joined in cooperative relationship with the emitter to provide an emitter junction between the emitter and the base element having N-type characteristics, a second base element having P-type characteristics and being joined in cooperative relationship with the base element having N-type characteristics to provide a collector junction between the base elements, a mass of metal joined in such intimate contact with the base element having P-type characteristics that electrons in the mass of metal upon energization will flow toward the collector junction, and electrode means attached to the emitter and mass of metal for effecting a predetermined flow of electrons to the collector junction when energized by suitable electrical potentials to render the diode device highly conductive and one electrode attached to the emitter and another electrode attached to the mass of metal, the two electrodes being the only conductors attached to the diode.

12. In a semiconductor diode in combination, an emitter, the emitter being germanium having predetermined semiconductivity characteristics, two germanium base members of opposite semiconductivity characteristics, the germanium base having semiconductivity characteristics opposite to that of the emitter being disposed next to and joined in cooperative relationship with the emitter to provide an emitter junction between the emitter and base, the other germanium base member being joined in cooperative relationship with the first base member to provide a collector junction between the two bases, a mass of metal joined in such intimate contact with the said other germanium base that minority carriers may flow from it to the other germanium base, the mass of metal being disposed within ten diffusion lengths from the collector junction and one electrode attached to the emitter and another electrode attached to the mass of metal, the two electrodes being the only conductors attached to the diode.

13. In a semiconductor diode in combination, an emitter, the emitter being germanium having predetermined semiconductivity characteristics, two germanium base members of opposite semiconductivity characteristics, the germanium base having semiconductivity characteristics opposite to that of the emitter being disposed next to and joined in cooperative relationship with the emitter to provide an emitter junction between the emitter and base, the other germanium base member being joined in cooperative relationship with the first base member to provide a collector junction between the two bases, a mass of metal joined in such intimate contact with the said other germanium base that minority carriers may flow from it to the other germanium base, the mass of metal being disposed within ten diffusion lengths from the collector junction, and means for impressing a reverse potential across the emitter and mass of metal to effect a flow of minority carriers to the collector junction to render the semiconductor diode highly conductive and one electrode attached to the emitter and another electrode attached to the mass of metal, the two electrodes being the only conductors attached to the diode.

14. In a semiconductor diode in combination, a two electrode structure having an emitter and two bases joined to one another, an emitter junction between the emitter and the one base, a collector junction between the two bases, the emitter being germanium doped with aluminum, the one base next to the emitter being germanium doped with arsenic, the other base being germanium doped with indium, a mass of metal disposed in intimate contact with the base, one electrode being attached to the emitter and the other to the mass of metal, electrons in the mass of metal, the mass of metal being located within ten diffusion lengths of the collector junction whereby electrons will flow to the collector junction when energized by electrical potential being applied to the electrode.

15. In a semiconductor diode in combination, a two electrode PNP structure comprising an emitter and two bases joined to one another, one base having N-type semiconductivity characteristics joined to the emitter to provide an emitter junction, the other base having P-type characteristics disposed in cooperative relationship with and joined to the one base, a collector junction between the bases and a mass of metal having neutral doping characteristics joined in intimate contact with the base having P-type characteristics, minority carriers contained in the neutral mass of metal, one electrode being attached to the emitter and the other to the mass of metal, the mass of metal being so disposed that it is within ten diffusion lengths of the collector junction whereby upon energization, the minority carriers may reach readily the collector junction when energized by electrical potential applied to the two electrodes.

16. In a semiconductor diode in combination, a two electrode structure comprising two bases, one base being germanium doped with indium, the said one base being from 0.005 inch to 0.007 inch thick and about one quarter inch in diameter, the other base being doped with arsenic and about .0002 inch thick and about 0.1 inch in diameter, the two bases being disposed in cooperative relationship to form a collector junction between the bases, an emitter, the emitter being germanium doped with aluminum, the germanium doped with aluminum emitter being fused to the said other base, silver fused to aluminum to facilitate the making of an electrical connection to the emitter, a mass of metal having the same doping carrier characteristics as the said one base, the mass of metal being alloyed with a portion of the said one base to provide such an intimate contact that carriers may flow from one to the other, the mass of metal being about .004 inch thick and so disposed that the carriers which it contains are within a predetermined diffusion length of the collector junction.

17. In a semiconductor diode in combination, a two electrode NPN semiconductor structure including an emitter doped with N-type impurities and two bases, one base being doped with P-type impurities, the other base being doped with N-type impurities, the base doped with P-type impurities being disposed in cooperative relationship with the emitter, an emitter junction between the emitter and base doped with P-type impurities, said other base doped with N-type impurities being disposed in cooperative relationship with the base doped with P-type impurities, a collector junction between the bases, a mass of metal having N-type doping characteristics, one electrode being attached to the emitter and the other electrode to the mass of metal, the two electrodes being the only conductors attached to the diode the mass of metal having minority carriers, the mass of metal being disposed in such intimate contact with the base doped with N-type impurities that the minority carriers may flow from one to the other when energized by an electrical potential applied to the two electrodes, the mass of metal being not over ten diffusion lengths from the collector junction.

18. In a semiconductor diode in combination, a two electrode structure having an emitter and two bases of opposite semiconductivity characteristics, a first base consisting of silicon doped with an impurity giving it predetermined semiconductivity characteristics, the second base comprising silicon doped with an impurity to give it opposite semiconductivity characteristics from the first base member, the first base member joined to the emitter in cooperative relationship therewith to provide an emitter junction between the emitter and first base, the other base being joined in cooperative relationship with the first base to provide a collector junction between the two bases, a mass of metal joined to the other base by the mass of metal having minority carriers, and one electrode attached to the emitter and another electrode attached to the mass of metal, the two electrodes being the only conductors attached to the diode the mass of metal being disposed in intimate contact with the other base to provide for the flow of carriers from one to the other upon energization by electrical potential, the mass of metal being within ten diffusion lengths from the collector junction.

19. In a semiconductor diode in combination, a two electrode structure provided with an emitter and two bases, the first base being disposed in cooperative relationship with the emitter and the second base disposed in cooperative relationship with the first base, a collector junction formed between the bases, a mass of metal fused to the second base, minority carriers contained in the mass of metal, the mass of metal being so disposed relative to the collector junction that the minority carriers are within a predetermined diffusion length from the collector junction, a source of power for applying a reverse voltage connected across the semiconductor diode to the emitter and mass of metal, the source of power imposing a predetermined voltage less than the breakdown voltage of the diode at the terminals of the diode, control means for applying a supplemental voltage across the diode to raise the voltage across the diode to a value where saturation occurs, whereby the diode may be rendered highly conductive, the diode when rendered highly conductive being capable of carrying a high current at a voltage of the order of one volt.

References Cited in the file of this patent

UNITED STATES PATENTS

| | | |
|---|---|---|
| 2,680,220 | Starr et al. | June 1, 1954 |
| 2,705,767 | Hall | Apr. 5, 1955 |
| 2,757,323 | Jordan et al. | July 31, 1956 |
| 2,759,133 | Mueller | Aug. 14, 1956 |
| 2,762,953 | Berman | Sept. 11, 1956 |
| 2,778,980 | Hall | Jan. 22, 1957 |
| 2,783,197 | Herbert | Feb. 26, 1957 |
| 2,840,494 | Parker | June 24, 1958 |
| 2,842,668 | Rutz | July 8, 1958 |
| 2,846,346 | Bradley | Aug. 5, 1958 |